(12) United States Patent
Holahan et al.

(10) Patent No.: US 9,999,156 B2
(45) Date of Patent: Jun. 12, 2018

(54) INTEGRATED CARD RAIL AND COOLING MODULE FOR EMBEDDED COMPUTING SYSTEMS

(71) Applicant: General Dynamics Mission Systems, Inc., Fairfax, VA (US)

(72) Inventors: Michael M. Holahan, St. Louis Park, MN (US); Nick R. Bober, Saint Paul, MN (US)

(73) Assignee: General Dynamics Mission Systems, Inc., Fairfax, VA (US)

(*) Notice: Subject to any disclaimer, the term of this patent is extended or adjusted under 35 U.S.C. 154(b) by 0 days. days.

(21) Appl. No.: 15/339,612

(22) Filed: Oct. 31, 2016

(65) Prior Publication Data
US 2018/0124950 A1 May 3, 2018

(51) Int. Cl.
*H05K 7/20* (2006.01)
*H05K 7/14* (2006.01)

(52) U.S. Cl.
CPC ....... *H05K 7/20272* (2013.01); *H05K 7/1418* (2013.01); *H05K 7/1422* (2013.01); *H05K 7/1424* (2013.01); *H05K 7/1425* (2013.01); *H05K 7/20* (2013.01); *H05K 7/20145* (2013.01); *H05K 7/20218* (2013.01); *H05K 7/20672* (2013.01)

(58) Field of Classification Search
None
See application file for complete search history.

(56) References Cited

U.S. PATENT DOCUMENTS

| | | | |
|---|---|---|---|
| 5,057,968 A * | 10/1991 | Morrison | H05K 7/1404 165/104.33 |
| 6,256,205 B1 * | 7/2001 | Perry | H05K 7/1424 211/41.17 |
| 7,324,336 B2 | 1/2008 | Vos et al. | |

(Continued)

FOREIGN PATENT DOCUMENTS

EP 3038151 A1 6/2016

OTHER PUBLICATIONS

Ivan Straznicky, Curtis-Wright Defense Solutions, 3U AFT (Air Flow Through)—Why Do We need Another Cooling Standard?, Symposium, Embedded Tech Trends, Jan. 2016.

(Continued)

*Primary Examiner* — Dimary Lopez Cruz
*Assistant Examiner* — Zhengfu Feng
(74) *Attorney, Agent, or Firm* — LKGlobal | Lorenz & Kopf, LLP

(57) ABSTRACT

A flow-through card rail module is provided in a circuit module chassis assembly for an embedded computing system. A set of elongated guide rails are formed on a base plate and define a card channel for receiving a circuit card. Each guide rail has a cooling passage extending from a fluid inlet to a fluid outlet. A corrugated structure is formed on an opposite side of the base plate and includes a set of elongated cells. Each elongated cell has a cooling passage formed therein extending from the fluid inlet to the fluid outlet. Internal walls subdivide the cooling passages formed in the guide rails and the elongated cells to form a honeycomb structure. The flow-through card rail module including the base plate, the guide rails and the corrugated structure may be formed as a monolithic component.

19 Claims, 6 Drawing Sheets

(56) References Cited

U.S. PATENT DOCUMENTS

| | | |
|---|---|---|
| 7,460,367 B2 | 12/2008 | Tracewell et al. |
| 8,477,498 B2 | 7/2013 | Porreca et al. |
| 9,357,670 B2 | 5/2016 | Stutzman et al. |
| 2007/0070601 A1* | 3/2007 | Vos ..................... H05K 7/1404 361/694 |
| 2008/0007913 A1 | 1/2008 | Sullivan et al. |
| 2011/0267776 A1* | 11/2011 | Porreca ................ H05K 7/1404 361/694 |
| 2012/0193138 A1* | 8/2012 | Jones .................... H05K 7/202 174/547 |
| 2014/0198457 A1 | 7/2014 | Wong et al. |
| 2015/0000871 A1 | 1/2015 | Farner et al. |

OTHER PUBLICATIONS

European Patent Office, Extended European Search Report for Application No. 17199475.9-1209 dated Feb. 28, 2018.

* cited by examiner

INTEGRATED CARD RAIL AND COOLING MODULE FOR EMBEDDED COMPUTING SYSTEMS

TECHNICAL FIELD

Embodiments of the subject matter described herein relate generally to a circuit card rail module for a circuit module chassis assembly and, more particularly, to an integrated card rail and cooling module.

BACKGROUND

A circuit module chassis assembly is typically used to mount industry standard circuit cards for various electronic applications, such as embedded computing systems. The circuit module chassis assembly may include a chassis supporting one or more rail modules for mechanically securing and electrically interconnecting the circuit cards and a power supply. Such circuit module chassis assemblies may be equipped with different circuit cards for various applications including but not limited to embedded computing systems for defense, military and aircraft applications. The circuit cards used in these applications and platforms typically include powered integrated circuits and other electronic components that generate significant heat which must be dissipated during operation. Such cooling has traditionally been accomplished by conducting heat away from the electronics through the circuit board and/or rail structure, then dissipating heat from the rail structure through natural or forced convection. In some instances, cooling air may be directed to impinge directly on the components and/or circuit card.

Recent trends with embedded computing systems are toward circuit cards which have higher speed and higher performance, but which generate a greater amount of heat. In response to this trend, circuit module chassis assemblies are incorporating additional cooling functions for removing heat generated by the electronics and more precisely maintaining the circuit cards within a given temperature range. These chassis assemblies may employ flow-through technology, in addition to the traditional methods of cooling, where a cooling fluid, in the form of a gas or a liquid, is directed through the structure of the chassis assembly to draw heat away from the electronics.

Enhanced module standards have been established that support applications and platforms from various manufacturers while ensuring compatibility and superior performance of the circuit module chassis assembly. In fact, VITA, the trade association responsible for setting standard computing architectures serving the embedded computing systems industry, is developing a new air flow through (AFT) cooling standard, VITA 48.8, for use in size, weight, power and cost (SWAP-C) constrained 3U and 6U VPX module-based systems.

Accordingly, there is a need for an integrated rail and cooling module that efficiently and effectively provides conduction-cooled circuit modules utilized in a chassis assembly configured with fluid-flow-through convection cooling.

BRIEF SUMMARY

In an embodiment, a flow-through card rail module includes a base plate defining a first major face and a second major face opposite the first major face. An elongated guide rail is formed on the first major face and extends from a first end of the base plate toward a second end opposite the first end. The guide rail defines a card channel configured to receive a circuit card. A corrugated structure is formed on the second major face and includes a plurality of elongated cells extending from the first end toward the second end of the base plate. Each elongated cell has a cooling passage formed therein which extends from a fluid inlet to a fluid outlet. The flow-through card rail module is configured to receive a cooling fluid at the fluid inlet, direct the cooling fluid through the cooling passages, and exhaust the cooling fluid at the fluid outlet.

In another embodiment, a flow-through card rail module includes a base plate defining a first major face and a second major face opposite the first major face. An end wall is formed on a first end of the base plate. A pair of side walls are formed on the sides of the base plate and extend from the first end and terminate at a marginal region of the base plate. A plurality of guide rails are formed on the first major face and extend from the first end to the marginal region of the base plate. Each guide rail has a cooling passage formed therein which extends from a fluid inlet formed through the end wall to a fluid outlet. Adjacent guide rails define a card channel therebetween that is configured to receive a circuit card. A corrugated structure is formed on the second major face and includes an outer face having a plurality of ridges and furrows and a plurality of elongated cells. Each elongated cell has a cooling passage formed therein which extends from the fluid inlet to the fluid outlet. The flow-through card rail module is configured to receive a cooling fluid at the fluid inlet, direct the cooling fluid through the cooling passages, and exhaust the cooling fluid at the fluid outlet.

In another embodiment, a circuit module chassis assembly is provided for an embedded computing system. A chassis assembly supports a card rail module and includes a pair of card rails that are arranged in a spaced facing relationship and configured to support a circuit card therebetween. A power supply is electrically coupled to the card rail module and configured to power the circuit card. A cooling system operates to draw a cooling fluid through the card rail module. Each card rail is configured as a flow-through card rail module for receiving cooling fluid from the cooling system at a fluid inlet, directing cooling fluid through cooling passages, and exhausting cooling fluid through a fluid outlet. In particular, a base plate defines a first major face and a second major face opposite the first major face. A plurality of elongated guide rails are formed on the first major face and extend from a first end of the base plate toward a second end opposite the first end. Adjacent guide rails define a card channel therebetween for receiving a circuit card. A corrugated structure is formed on the second major face and includes a plurality of elongated cells extending from the first end toward the second end of the base plate. Each elongated cell has a cooling passage which extends from a fluid inlet in communication with the cooling system to a fluid outlet.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the subject matter described herein generally relate to an integrated card rail and cooling module. In accordance with one embodiment, for example, several integrated card rail and cooling modules are arranged in a chassis assembly with circuit cards to provide a flow-through cooling function for an embedded computing system.

Figure 1:
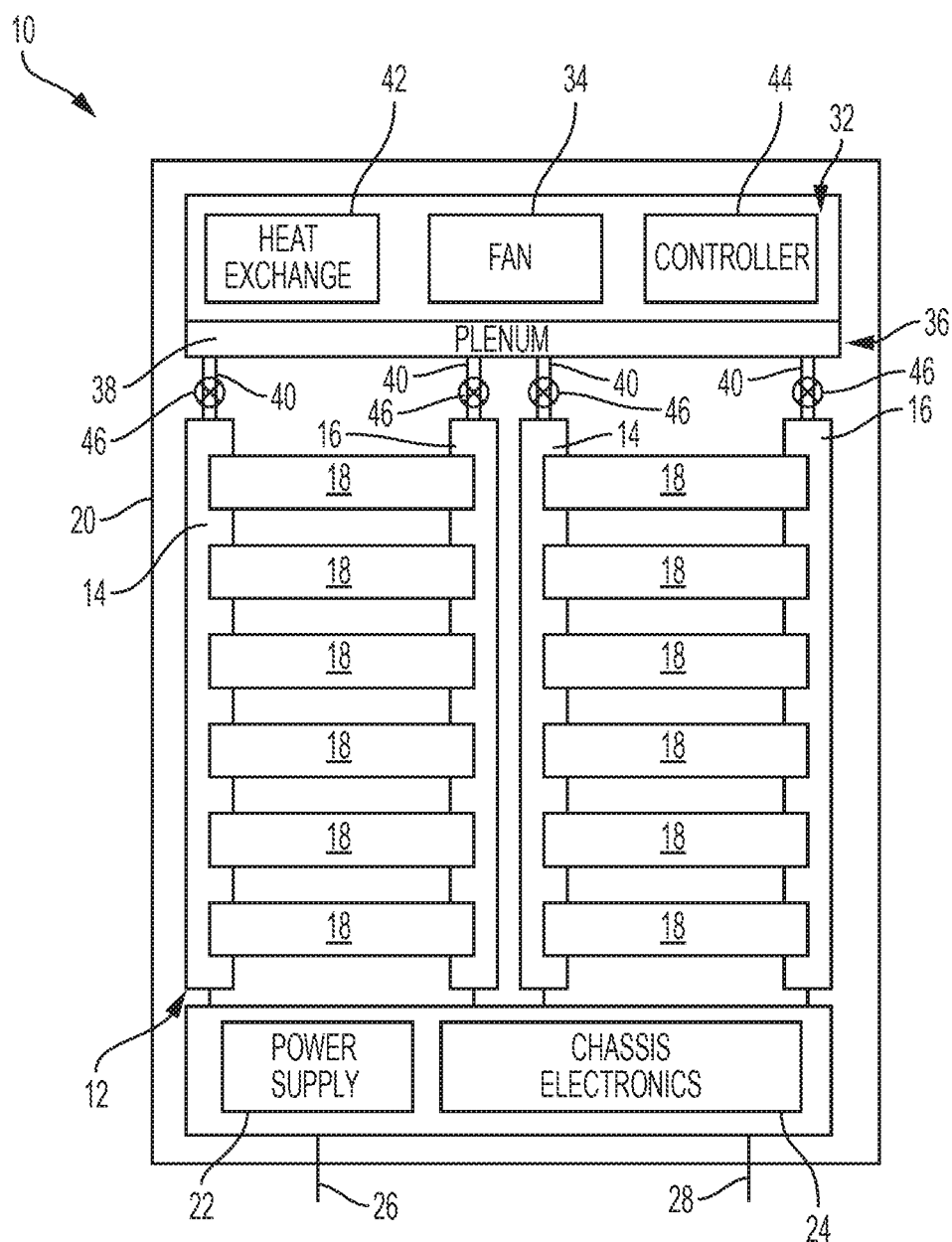
FIG. 1 is a schematic diagram showing an exemplary embodiment of an embedded computing system having a chassis assembly supporting card rails and circuit cards and configured with fluid-flow-through cooling in accordance with the present disclosure.

Referring now to FIG. 1, an embedded computing system 10 includes a chassis assembly 12 supporting two card rails 14, 16 arranged in a spaced facing relationship and configured to receive a plurality of circuit cards 18. As shown in FIG. 1, the chassis assembly 12 is configured to support two sets of card rails 14, 16, each set holding six circuit cards 18. One skilled in the art will appreciate that the number and location of the card rails and circuit cards supported in the chassis assembly 12 may be adapted based on the specification and functionality of the embedded computing system 10. Furthermore, while the disclosed subject matter contemplates application in standard computing architectures, such as described above, the integrated rail and cooling module further detailed below may be adapted for other unique applications requiring enhanced cooling functionality in a lightweight, compact card chassis.

With continued reference to FIG. 1, the chassis assembly 12 includes a housing 20 enclosing a power supply 22 and chassis electronics 24 electrically coupled to the card rails 14, 16 for powering, controlling, communicating, monitoring and interfacing with the circuit cards 18. Interfaces 26, 28 may provide communication with external electronic components and/or electrical power to the embedded computing system 10. The chassis assembly 12 also includes a cooling system 32 operable for drawing a cooling fluid through the chassis assembly 12 and the card rails 14, 16 to affect cooling of the electronics mounted on the circuit cards 18 within the embedded computing system 10. The cooling system 32 includes a fan or pump 34 for drawing the cooling fluid into a manifold 36 having a plenum 38 and supply ducts 40 in fluid communication with the card rails 14, 16 as further detailed herein. The cooling system 32 may also include a heat exchanger 42 for conditioning the cooling fluid in the manifold 36. The heat exchanger 42 may take the form of a simple radiator or a more complex vapor-compression heat exchanger system. The cooling system 32 may also include a controller 44 configured to receive data concerning the thermal state of the components of the embedded computing system 10 and control operation of the cooling system 32 in response thereto. Such control may include operation of the fan or pump 34 and/or control of supply valves 46 disposed in the supply ducts 40.

With reference now to FIGS. 2-6, further details regarding an integrated card rail and cooling module 100, or simply "card rail 100" are provided with the understanding that the card rail 100 is suitable for use as card rails 14, 16 arranged in spaced facing relation as described above. Card rail 100 includes a planer base plate 102 framed by a pair of side walls 104, 106 and an end wall 108 extending generally perpendicular to the base plate 102. The end wall 108 is formed at a first end of the base plate 102 and defines an inlet end of the card rail 100.

Figure 2:
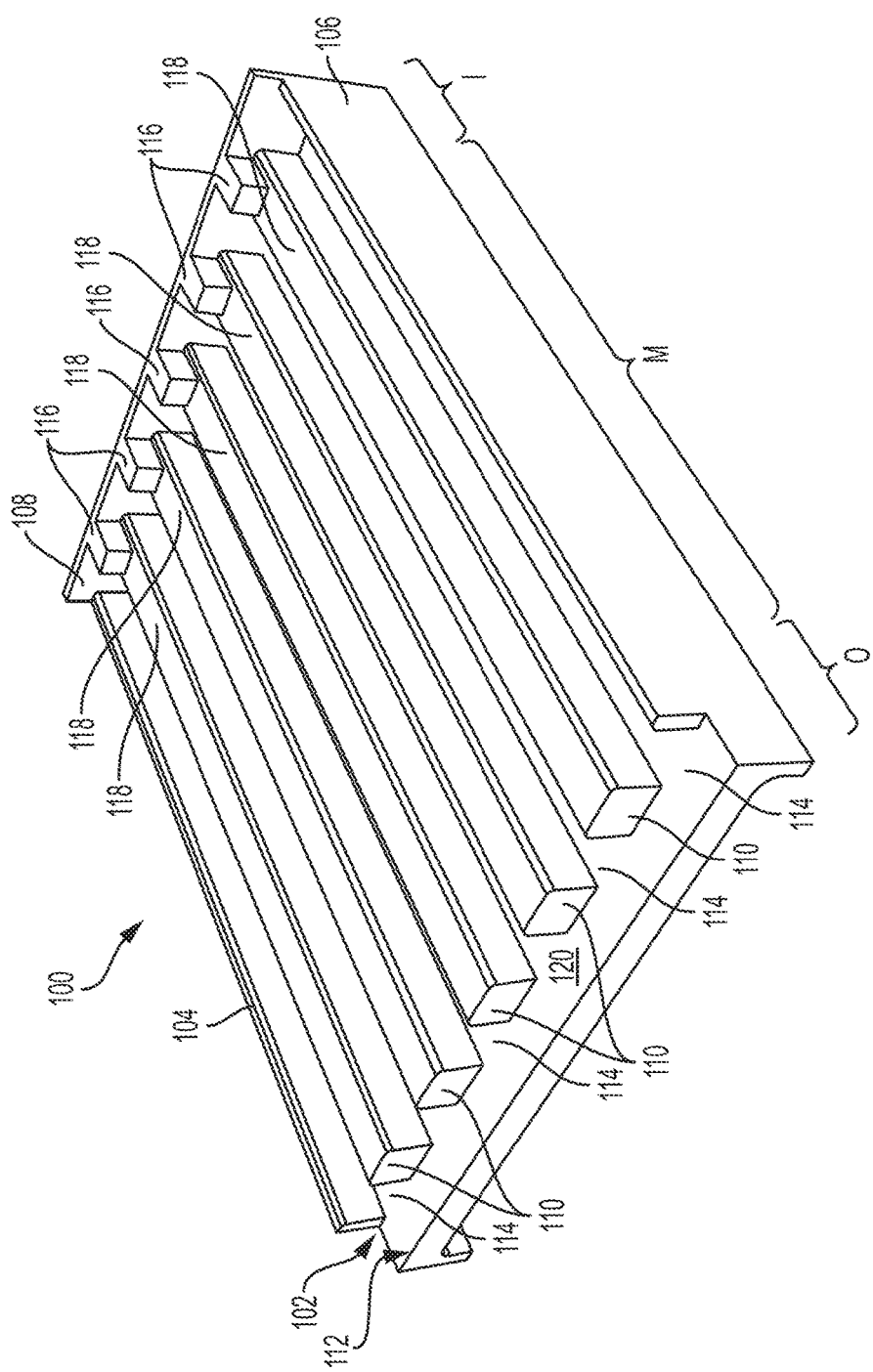
FIG. 2 is a top perspective view of an exemplary embodiment of an integrated rail and cooling module schematically shown in FIG. 1.
Figure 4:
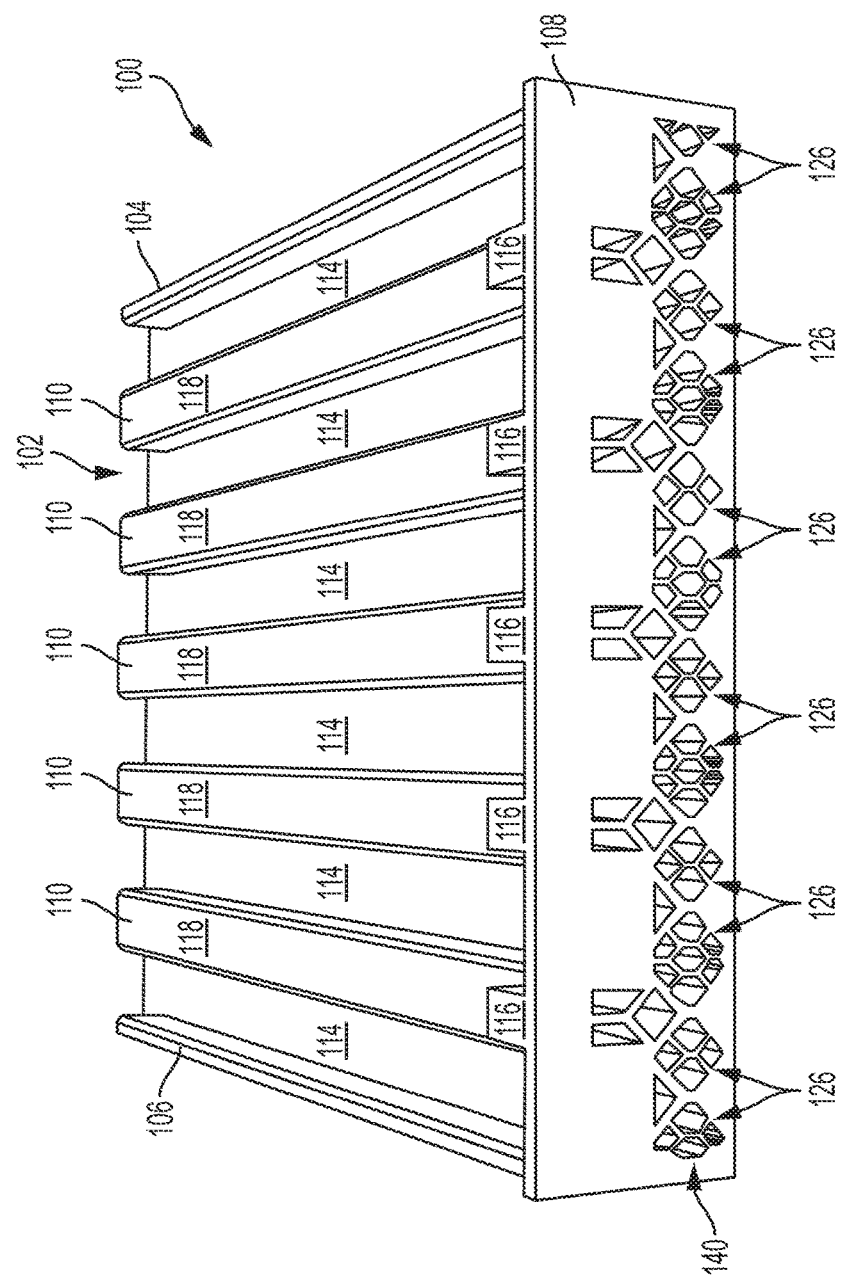
FIG. 4 is a perspective end view showing the inlet side end of the cooling passages formed on the bottom of the integrated rail and cooling module shown in FIG. 2.

As shown in FIGS. 2 and 4, a plurality of elongated guide rails 110 are formed on a first major face 112 of the base plate 102 and extend from the end wall 108 toward a second end of the base plate 102. The guide rails 110 are arranged in a spaced relationship on the first major face 112, which in combination with the side walls 104, 106 define a plurality of card channels 114. Each card channel 114 is configured to securely receive a circuit card 18 in a conventional manner. A buttress 116 formed on a top surface 118 of each guide rail 110 against the end wall 108 and provides a boss for mounting a backplane that supports the circuit cards 18. As best seen in FIG. 2, the guide rails 110 terminate before the second end of the base plate 102 to define a marginal region 120 thereon.

Figure 3:
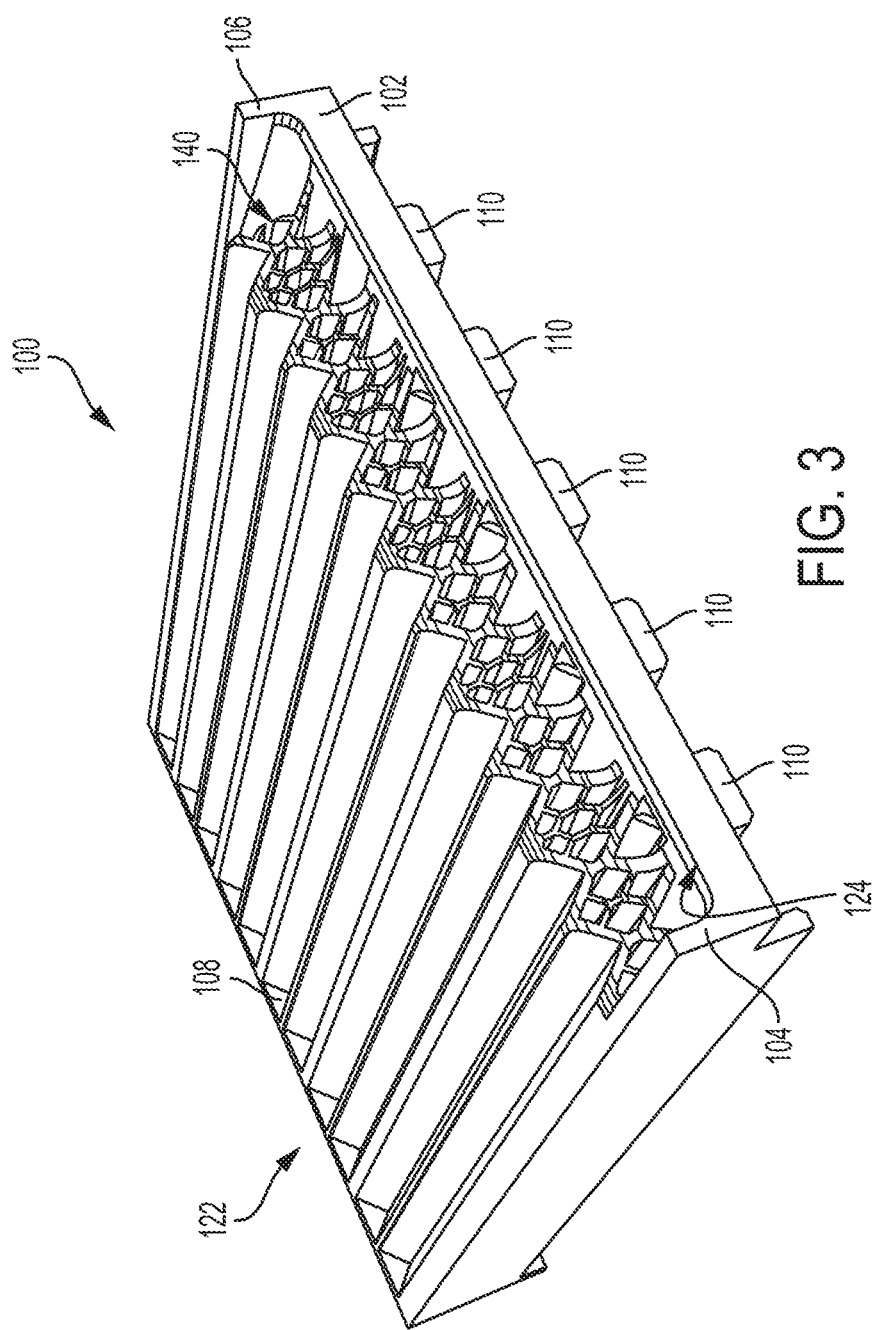
FIG. 3 is a bottom perspective view of the integrated rail and cooling module shown in FIG. 2.
Figure 5:
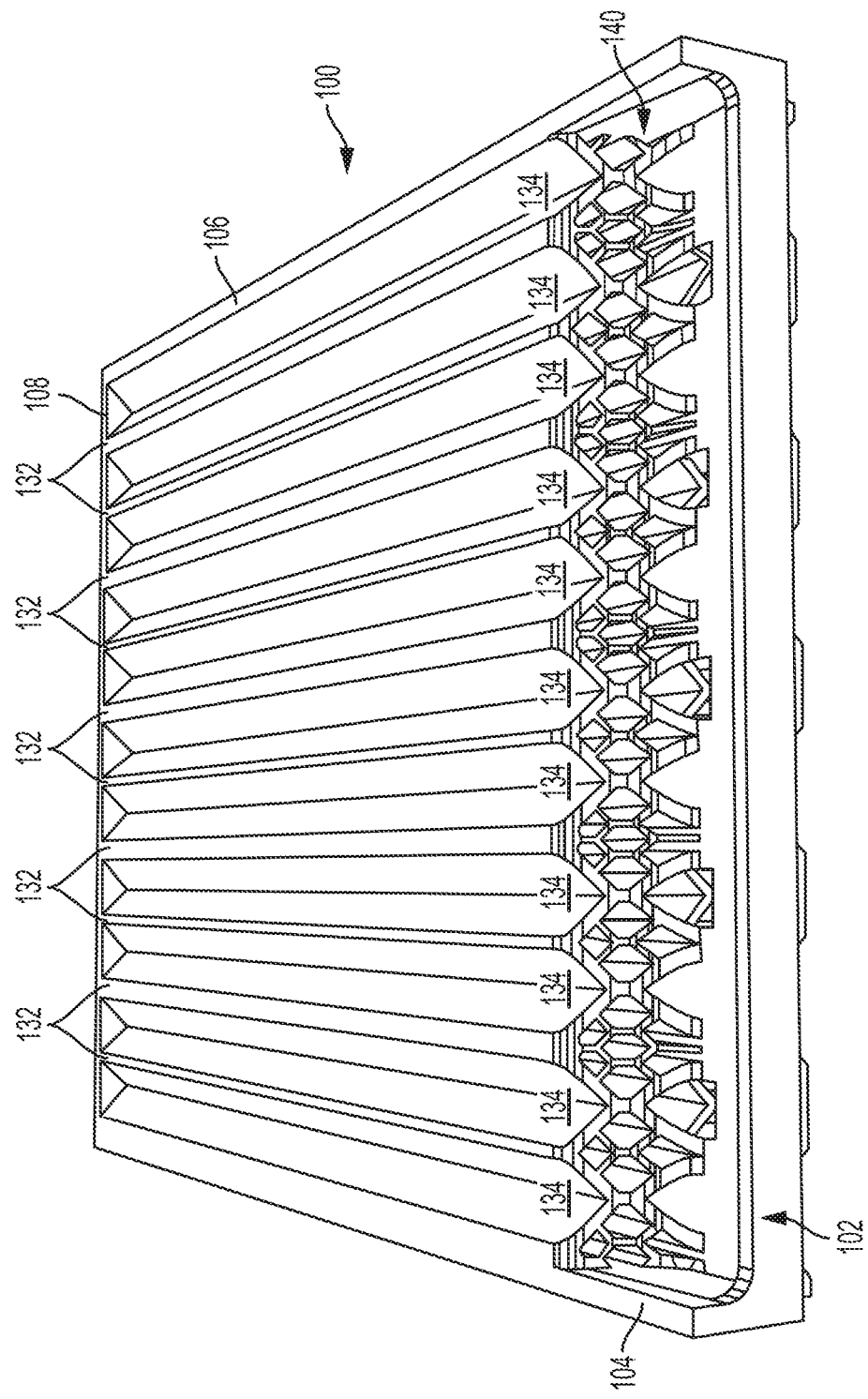
FIG. 5 is a perspective end view showing the exhaust side of the cooling passages formed on the bottom of the integrated rail and cooling module shown in FIG. 2.
Figure 6:
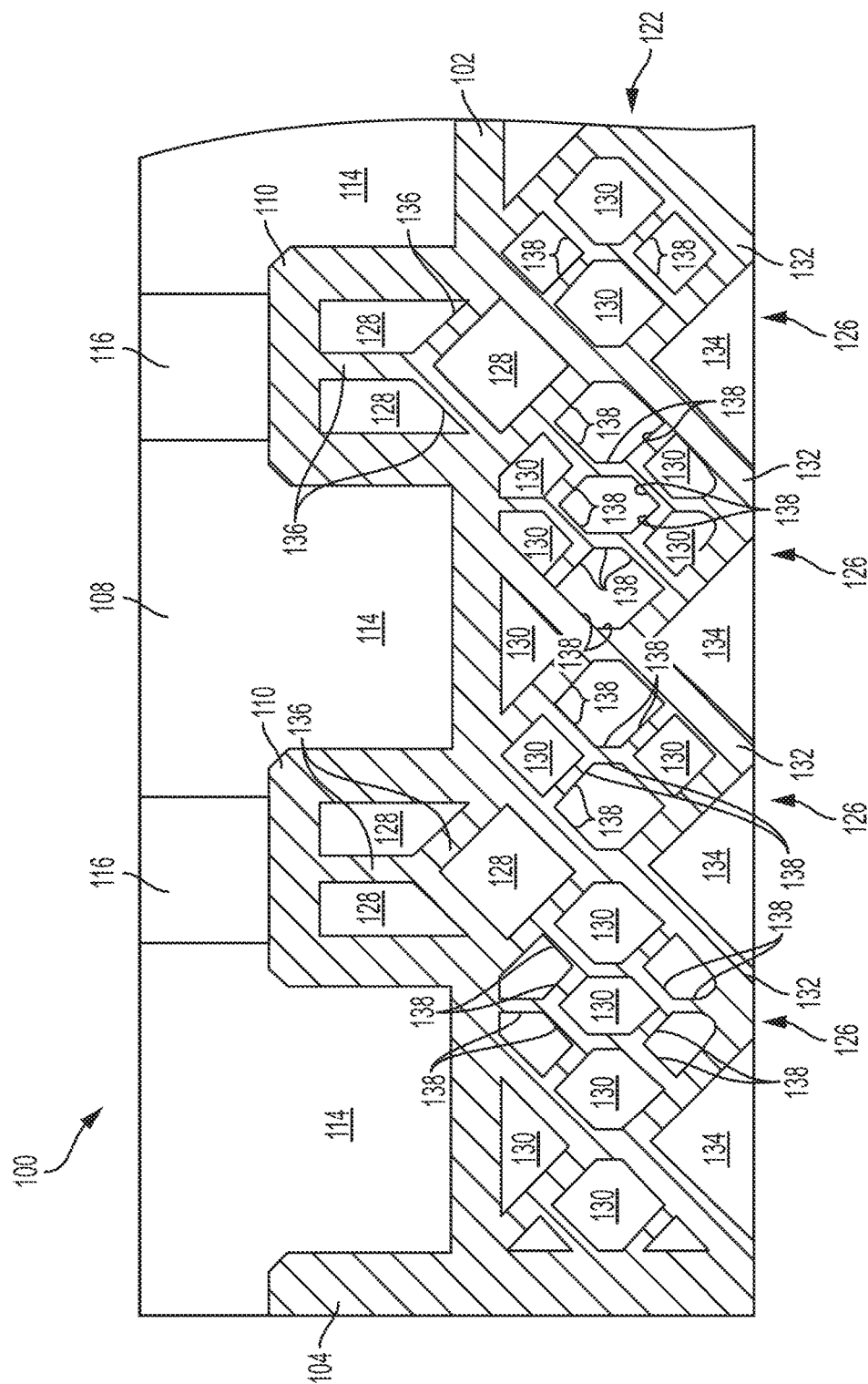
FIG. 6 is a cross-sectional detail showing the cooling passages formed through the guide rail and corrugated structure in the integrated rail and cooling module shown in FIG. 2.

As shown in FIGS. 3 and 5, a corrugated structure 122 is formed on a second major face 124 of the base plate 102 opposite the first major face 112. The corrugated structure 122 includes a plurality of elongated cells 126, which define ridges 132 and furrows 134 on an outer face of the corrugated structure 122. In this configuration, the surface area of the corrugated structure 122 is significantly greater than the surface area of the second major face 124. As best seen in FIG. 6, the elongated cells 126 are arranged on the opposite side of the base plate 102 from the first major face 112 and laterally offset with respect to the guide rails 110 formed thereon.

As previously discussed, card rail 100 is configured to provide a flow-through cooling function. To wit, cooling passages 128, 130 are formed through the guide rails 110 and the elongated cells 126, respectively. The cooling passages 128,130 extend through the end wall 108 to define a fluid inlet in the card rail 100 as best shown in FIG. 4. With reference now to FIGS. 3 and 5, the cooling passages 128 extending through the guide rails 110 pass from the first major 112 through the second major face 124 of the base plate and terminate at the marginal region 120 to define a fluid outlet in the card rail 100. Likewise, the cooling passages 130 extend through the elongated cells 126 and terminate at the marginal region 120 of the second major face 124 to further define the fluid outlet in the card rail 100.

With reference now to FIG. 6, the cooling passages 128, 130 may be subdivided by internal walls 136, 138 to form a grouping of smaller channels that define a honeycombed cross-section 140. For the sake of clarity, not all cooling passages 128, 130 or internal walls 136, 138 are labelled in the figures. The internal walls 136 provides sufficient internal support such that the guide rails 110 adequately support the circuit cards 18; whereas the internal walls 138 provide such that the corrugated structure 122 may be load bearing. In this regard, the card rails 100 may be integrated into the chassis assembly 12 as a portion of the housing 20 for the embedded computing system 10 shown in FIG. 1.

With continued reference to FIG. 6, the internal walls 136 subdivide the cooling passages 130 in the elongated cells 126 and are arranged in an alternating pattern. One skilled in the art will recognize that the specific configuration of the internal walls 136 may be adapted based on the specifications and functional requirements of a given application such that honeycombed cross-section may have a different cross-sectional geometry than specifically illustrated in the figures. In this regard, the term honeycomb refers to a grouping of small channels regardless of the particular cross-section. For example, the effective cross-sectional area of the cooling passages 128 may be configured to maintain a particular pressure drop across the card rail 100 and/or a particular flow rate through the card rail 100. Similarly, the effective cross-sectional area of the cooling passages 128, 130 as well as the surface area of the corrugated structure 122 may be configured to provide a card rail capable of dissipating the thermal load from the circuit cards 118 to maintain a target rail temperature, for example an 85° C. rail temperature.

In one embodiment, the card rail 100 is formed as a one-piece or monolithic component from a single material. In this regard, the card rail 100 may be fabricated using a direct metal laser sintering process using a structurally strong, highly-conductive material. For example, the card rail 100 may be formed from an Al—Si—Mg or Ti powdered metal alloy. When formed as a monolithic component, the card rail 100 has a consistent thermal conductivity throughout, and thus eliminates thermal resistance boundaries and air gaps that would otherwise exist at the interface of disparate materials or components.

In another embodiment, a middle portion M of the card rail 100 is formed as a one-piece or monolithic component and the inlet portion I and an outlet portion O of the card rail 100 are formed as separate components that are joined to the middle portion M. In this regard, the middle portion M may be extruded using a structurally strong, highly-conductive material. The inlet and outlet portions I, O are then mated to the middle portion M in a mechanically joined manner with fasteners or the like, or in a materially joined manner by bonding, welding, brazing or the like.

For simplicity sake, FIG. 1 schematically illustrates the side wall of the card rails as being fluidly coupled to the supply ducts 40 of the manifold 36, however in practice the manifold 36 is fluidly coupled to the cooling passages 128, 130 formed in the card rail 100. In one embodiment, the end wall 108 of the card rail 100 is fluidly coupled to the manifold 36 such that the inlet end of the card rail 100 is in fluid communication with the manifold 36. The card rail 100 is arranged in the chassis assembly 12 such that cooling fluid is exhausted from outlet end the card rail 100 out of the chassis assembly 12 into the ambient environment surrounding the embedded computing system 10. In other words, cooling fluid is drawn through the chassis assembly 12 by the fan 34 into the plenum 38. The cooling fluid may optionally be conditioned by the heat exchanger 42. The cooling fluid is then directed through the supply ducts 40 into the cooling passages 128, 130 formed in card rails 14, 16, 100.

In the above-described embodiment, the cooling system 32 is configured to create a pressure differential that forces the cooling fluid through the card rail from the manifold 36 to the marginal region 120 of the base plate 102. Thus, the fluid inlet is defined adjacent the end wall 108 and the fluid outlet is defined adjacent the marginal region 120. However, in an alternate embodiment, the cooling system 32 may be configured to create a pressure differential that draws the cooling fluid through the card rail 100 from the marginal region 120 to the end wall 108. In such an embodiment, the fluid inlet is defined adjacent the marginal region 120 and the fluid outlet is defined adjacent to the end wall 108. As such, one skilled in the art should understand that the terms "inlet" and "outlet" are relative to the fluid flow direction and should not be limited to a specific structure or location in the described embodiments.

The configuration of the cooling passages 128, 130 through the guide rails 110 and elongated cells 126 provides direct cooling where needed. In particular, heat generated by components of the embedded computing system is conducted from the circuit cards 18 to the card rail 100 and through guide rails 110 and the corrugated structure 122. As a result of the cooling fluid passing through the cooling passages 128, 130, heat is dissipated from the card rail 100 by forced convention. Heat is also dissipated from the corrugated structure 122 of the card rail 100 by natural convection. As such, the configuration of the card rail 100 provides a multi-mode heat transfer mechanism where cooling is specifically required.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A flow-through card rail module comprising:
a base plate defining a first major face and a second major face opposite the first major face;
an elongated guide rail formed on the first major face and extending from a first end of the base plate toward a second end opposite the first end, a first section of a cooling passage is formed in the guide rail from a fluid inlet to a fluid outlet and passes through the base plate from the first major face to the second major face, wherein the guide rail defines a card channel configured to receive a circuit card; and
a corrugated structure formed on the second major face including a plurality of elongated cells extending from the first end toward the second end of the base plate, each elongated cell having a second section of the cooling passage formed therein which extends from the fluid inlet to the fluid outlet;
wherein the flow-through card rail module is configured to receive a cooling fluid at the fluid inlet, direct the cooling fluid through the cooling passages, and exhaust the cooling fluid at the fluid outlet.

2. The flow-through card rail module according to claim 1, wherein an outer face of the corrugated structure comprises a plurality of ridges and furrows.

3. The flow-through card rail module according to claim 1, wherein each elongated cell comprises at least one internal wall subdividing the second section of the cooling passage and forming a honeycombed cross-section in the elongated cell.

4. The flow-through card rail module according to claim 1, wherein the elongated guide rail comprises at least one internal wall subdividing the first section of the cooling passage and forming a honeycombed cross-section in the elongated guide rail.

5. The flow-through card rail module according to claim 1, wherein the base plate further comprises a marginal region extending from an end of the plurality of elongated guide rails at the second end of the base plate.

6. The flow-through card rail module according to claim 1, further comprising an end wall at the first end and a pair of side walls extending from the first end towards the second end, wherein the end wall and the pair of side walls extend perpendicular to frame the base plate.

7. The flow-through card rail module according to claim 6, wherein the elongated guide rail further comprises a mounting boss formed adjacent the end wall and configured to mount a backplane for supporting the circuit card.

8. The flow-through card rail module according to claim 1, wherein the base plate, the guide rail and the corrugated structure comprise a monolithic component.

9. A flow-through card rail module comprising:
a base plate defining a first major face and a second major face opposite the first major face;
an end wall formed on a first end of the base plate;
a pair of side walls formed on a pair of sides of the base plate and extending from the first end and terminating at a marginal region of the base plate;
a plurality of guide rails formed on the first major face and extending from the first end to the marginal region of the base plate, each guide rail having a first section of a cooling passage formed therein which extends from a fluid inlet formed through the end wall to a fluid outlet, wherein adjacent guide rails define a card channel therebetween which is configured to receive a circuit card, wherein adjacent guide rails define a card channel therebetween which is configured to receive a circuit card;
a corrugated structure formed on the second major face including an outer face having a plurality of ridges and furrows and a plurality of elongated cells, each elongated cell having a second section of the cooling passage formed therein which extends from the fluid inlet to the fluid outlet; and
a plurality of internal walls subdividing the first and second sections of the cooling passage to form a honeycombed cross-section in the guide rails and elongated cells;
wherein the flow-through card rail module is configured to receive a cooling fluid at the fluid inlet, direct the cooling fluid through the cooling passages, and exhaust the cooling fluid at the fluid outlet.

10. The flow-through card rail module according to claim 9, wherein the base plate, the side walls, the guide rails and the corrugated structure comprise a monolithic component.

11. The flow-through card rail module according to claim 9, wherein each elongated guide rail further comprises a mounting boss formed adjacent the end wall and configured to mount a backplane for supporting the circuit card.

12. The flow-through card rail module according to claim 9, wherein the first section of the cooling passage formed in each of the elongated guide rails passes through the base plate from the first major face to the second major face at the fluid outlet.

13. A circuit module chassis assembly for an embedded computing system comprising:

a chassis assembly supporting a card rail module including a pair of card rails arranged in a spaced facing relationship and configured to support a circuit card therebetween;
a power supply electrically coupled to the card rail module and configured to power the circuit card; and
a cooling system operable to draw a cooling fluid through the card rail module,
wherein each of the pair of the card rails comprises a flow-through card rail module having:
a base plate defining a first major face and a second major face opposite the first major face;
a plurality of elongated guide rails formed on the first major face and extending from a first end of the base plate toward a second end opposite the first end, a first section of a cooling passage formed in each elongated guide rail from a fluid inlet to a fluid outlet and passes through the base plate from the first major face to the second major face, wherein adjacent guide rails define a card channel therebetween for receiving the circuit card;
a corrugated structure formed on the second major face including a plurality of elongated cells extending from the first end toward the second end of the base plate, each elongated cell having a second section of the cooling passage which extends from the fluid inlet to the fluid outlet, wherein the fluid inlet is in communication with the cooling system;
wherein the flow-through card rail module receives the cooling fluid from the cooling system at the fluid inlet, directs the cooling fluid through the cooling passages, and exhausts the cooling fluid at the fluid outlet.

14. The circuit module chassis assembly according to claim 13, wherein the flow-through card rail module including the base plate, the guide rails and the corrugated structure comprise a monolithic component.

15. The circuit module chassis assembly according to claim 13, wherein the cooling system further comprises a manifold in fluid communication with the fluid inlet, a fan for drawing the cooling fluid into the manifold, and a controller operably coupled to the manifold and configured to receive data concerning the thermal state of the card rail and to control operation of the cooling system in response to the data.

16. The circuit module chassis assembly according to claim 13 further comprising a housing, wherein at least one card rail is integrated into the chassis assembly such that the corrugated structure forms a portion of the housing.

17. The circuit module chassis assembly according to claim 13, further comprising a plurality of internal walls subdividing the first and second cooling passages extending through the guide rails and the elongated cells to form a honeycombed cross-section in the guide rails and elongated cells.

18. The circuit module chassis assembly according to claim 13, wherein the plurality of elongated cells formed on the second major face are laterally offset with respect to the plurality of guide rails formed on the first major face.

19. The flow-through card rail module according to claim 9, wherein the plurality of elongated cells formed on the second major face are laterally offset with respect to the plurality of guide rails formed on the first major face.

* * * * *